(12) United States Patent
Lovseth et al.

(10) Patent No.: US 10,731,959 B1
(45) Date of Patent: Aug. 4, 2020

(54) DEPLOYABLE ACTIVE RADAR COUNTERMEASURES

(71) Applicant: Rockwell Collins, Inc., Cedar Rapids, IA (US)

(72) Inventors: Jonathan A. Lovseth, Marion, IA (US); Anders P. Walker, Marion, IA (US); Russell D. Wyse, Center Point, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 379 days.

(21) Appl. No.: 15/870,517

(22) Filed: Jan. 12, 2018

(51) Int. Cl.
| | |
|---|---|
| *F42B 12/38* | (2006.01) |
| *H03H 11/20* | (2006.01) |
| *H03H 7/01* | (2006.01) |
| *H03H 7/12* | (2006.01) |
| *H03H 7/21* | (2006.01) |
| *H01Q 1/28* | (2006.01) |
| *H04B 1/10* | (2006.01) |
| *G01S 7/38* | (2006.01) |
| *G01S 7/495* | (2006.01) |
| *H01Q 1/22* | (2006.01) |
| *H03H 9/70* | (2006.01) |

(52) U.S. Cl.
CPC ............ *F42B 12/382* (2013.01); *G01S 7/38* (2013.01); *G01S 7/495* (2013.01); *H01Q 1/22* (2013.01); *H01Q 1/28* (2013.01); *H03H 7/0161* (2013.01); *H03H 7/12* (2013.01); *H03H 7/21* (2013.01); *H03H 9/70* (2013.01); *H03H 11/20* (2013.01); *H04B 1/1036* (2013.01)

(58) Field of Classification Search
CPC .......... F42B 12/382; G01S 7/38; G01S 7/495; H01Q 1/22; H01Q 1/28; H03H 7/0161; H03H 7/12; H03H 7/21; H03H 9/70; H03H 11/20; H04B 1/1036; F41J 2/00
USPC .......................................................... 342/12
See application file for complete search history.

(56) References Cited

U.S. PATENT DOCUMENTS

| | | | | |
|---|---|---|---|---|
| 4,137,532 A | * | 1/1979 | Taylor, Jr. ........... | G01S 13/5248 342/137 |
| 4,608,566 A | * | 8/1986 | Ennis .................. | G01S 13/4445 342/149 |

(Continued)

FOREIGN PATENT DOCUMENTS

| | | | | |
|---|---|---|---|---|
| WO | WO-2011121081 A1 | * | 10/2011 | ........... G01S 13/867 |

*Primary Examiner* — Peter M Bythrow
*Assistant Examiner* — Nuzhat Pervin
(74) *Attorney, Agent, or Firm* — Suiter Swantz pc llo

(57) ABSTRACT

A deployable active radar countermeasure or "smart chaff" device includes a flexible battery or length of reflective material for passive reflection of a surveillance radar signal. Metallized antenna elements printed onto the material receive the surveillance radar signals, and RF integrated circuitry bonded to the material generates active RF echo signals based on the frequency of the surveillance signal and the length of the material. Wirebond receiving paths include reconfigurable gain amplifiers and filters for adjusting the phase and amplitude of the echo signal, and transmit paths return the echo signal to the radar source via the antenna elements. Echo signals may combine with those of other such devices, having various lengths and associated frequencies, to simulate a false return associated with a particular aircraft or moving target (e.g., simulation of Doppler shift via offset echo frequencies).

12 Claims, 4 Drawing Sheets

(56) References Cited

U.S. PATENT DOCUMENTS

| | | | | |
|---|---|---|---|---|
| 4,686,534 A * | 8/1987 | Eddy | G01S 7/4052 | 342/160 |
| 5,173,703 A * | 12/1992 | Mangiapane | G01S 13/90 | 342/149 |
| 5,223,842 A * | 6/1993 | Okurowski | G01S 7/36 | 342/173 |
| 5,225,838 A * | 7/1993 | Kanter | G01S 7/36 | 342/61 |
| 5,245,347 A * | 9/1993 | Bonta | G01S 7/2813 | 342/149 |
| 5,361,072 A * | 11/1994 | Barrick | G01S 7/35 | 342/133 |
| 5,847,675 A * | 12/1998 | Poinsard | F41G 7/2246 | 342/81 |
| 5,929,810 A * | 7/1999 | Koutsoudis | H01Q 3/267 | 342/174 |
| 6,628,239 B1 * | 9/2003 | Hilliard | H01Q 15/148 | 342/12 |
| 6,980,151 B1 * | 12/2005 | Mohan | G01S 7/414 | 342/118 |
| 7,369,081 B1 * | 5/2008 | Ganz | H01Q 15/145 | 342/12 |
| 7,400,287 B2 * | 7/2008 | Saccomanno | H01Q 15/145 | 244/3.1 |
| 7,417,582 B2 * | 8/2008 | Troutman | F42C 11/008 | 102/214 |
| 8,537,048 B2 * | 9/2013 | Dunn | F42B 12/382 | 342/12 |
| 8,542,145 B2 * | 9/2013 | Galati | G01S 13/878 | 342/107 |
| 8,836,569 B1 * | 9/2014 | James | H01Q 15/14 | 342/3 |
| 9,213,090 B2 * | 12/2015 | Paoletti | G01S 13/04 | |
| 9,240,815 B1 * | 1/2016 | Wyse | H03H 9/70 | |
| 10,014,587 B1 * | 7/2018 | Boulais | G02B 5/13 | |
| 10,317,518 B2 * | 6/2019 | Warnick | G01S 7/032 | |
| 2003/0137442 A1 * | 7/2003 | Baliarda | H01Q 15/145 | 342/12 |
| 2006/0087472 A1 * | 4/2006 | Troutman | F42C 11/008 | 342/68 |
| 2007/0190368 A1 * | 8/2007 | Jung | F41H 3/00 | |
| 2008/0088508 A1 * | 4/2008 | Smith | G01S 5/06 | 342/453 |
| 2009/0189799 A1 * | 7/2009 | Ganz | H01Q 15/145 | 342/12 |
| 2009/0252913 A1 * | 10/2009 | Cincotti | F41H 3/02 | 428/41.3 |
| 2010/0283655 A1 * | 11/2010 | Dunn | F42B 12/382 | 342/12 |
| 2011/0128181 A1 * | 6/2011 | Galati | G01S 13/003 | 342/107 |
| 2014/0009319 A1 * | 1/2014 | Geswender | F41H 11/02 | 342/5 |
| 2015/0276917 A1 * | 10/2015 | Dawber | G01S 5/06 | 342/25 A |
| 2016/0061949 A1 * | 3/2016 | Mohamadi | G01S 13/89 | 342/21 |
| 2017/0045613 A1 * | 2/2017 | Wang | G01S 13/343 | |
| 2017/0352963 A1 * | 12/2017 | Hurzon | F41J 2/00 | |
| 2018/0011180 A1 * | 1/2018 | Warnick | G01S 7/352 | |

* cited by examiner

DEPLOYABLE ACTIVE RADAR COUNTERMEASURES

BACKGROUND

Adversaries commonly use radar to track radar-guided missiles and other airborne targets; for example, pulsed or continuous radio waves may be projected toward potential targets, and the reflections of these waves analyzed to locate the potential target or determine its heading and velocity. Advanced radar detection systems may utilize complicated pulse waveforms more broadly distributed across the radio frequency (RF) spectrum.

A target or potential target may deploy chaff as a radar countermeasure; for example, a cloud of metallic or reflective objects may be deployed to reflect radar waves so as to confuse the radar detection system with multiple or misleading target returns which may suggest a false position of the target or obscure its true position. However, conventional chaff may be of limited utility; for example, individual chaff components have no means of propulsion and thus, to the extent that a cloud of chaff may represent a false or misleading position of a target, it may provide only a static position. Similarly, the reflectivity of conventional chaff may depend greatly on the surveillance frequencies used. Towable decoys may provide more credibly false returns to surveillance radar, but the decoys may not be a cost-effective option. Similarly, a target aircraft may employ onboard digital RF memory (DRFM) to generate false echo signals representing a "ghost" decoy target. While the ghost target may prove a reusable and programmable decoy (e.g., a decoy presenting the illusion of motion toward the detector), DRFM systems may be even more prohibitively expensive than towable decoys (e.g., by a cost factor ten times or above that of the towable decoy).

SUMMARY

In one aspect, embodiments of the inventive concepts disclosed herein are directed to a deployable active radar countermeasure or "smart chaff" device. The device includes a flexible battery or predetermined length of passively reflective material upon which antenna elements are printed for receiving surveillance radar signals passively reflected by the material. RF integrated circuitry is bonded to the material for generating an active RF echo signal based on the received surveillance signal. For example, wirebond receiving paths may receive the surveillance signal and adjust the phase and amplitude of the echo signal via reconfigurable filtering components. Transmit paths of the RF integrated circuitry relay the adjusted active RF echo signal to the radar source via the antenna elements, generating a false return indicating the reflective pattern of a particular aircraft (e.g., along with other such devices having a variety of lengths and an associated variety of echo frequency ranges) or a simulated Doppler shift indicating a moving target.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION OF EXEMPLARY EMBODIMENTS

Figure 1:
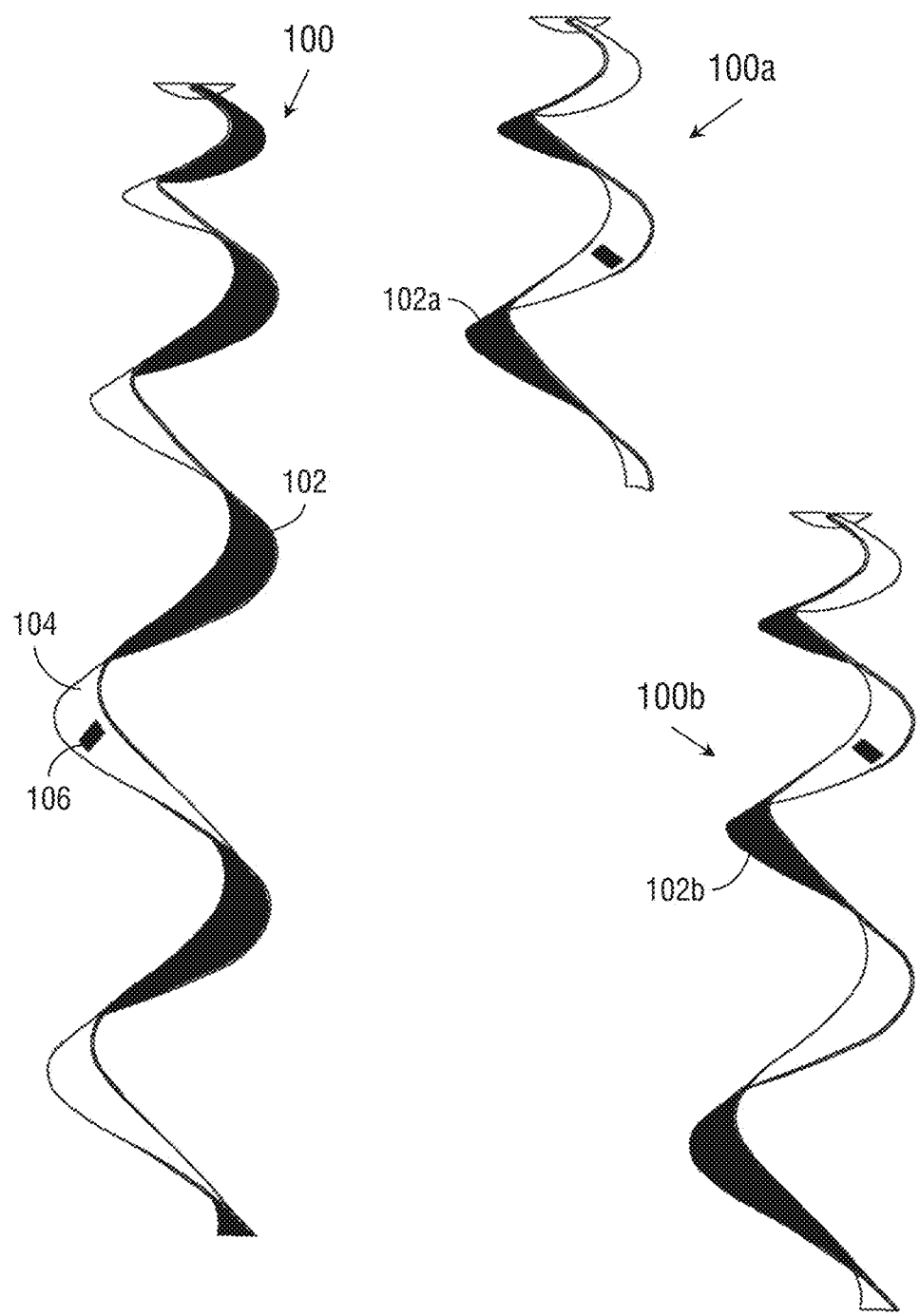
FIG. 1 illustrates exemplary embodiments of deployable active radar countermeasures according to the inventive concepts disclosed herein.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a deployable active radar countermeasure system. The deployable countermeasure devices, or "smart chaff", provide passive reflectivity of surveillance radar signals as well as programmable active RF echoes capable of presenting a desired reflection profile (e.g., a particular aircraft) or simulating a moving target. Active RF echo functionality may be achieved via mass deployment of the "smart chaff" without the expense of towable decoys or complex onboard digital RF memory (DRFM) systems.

Referring to FIG. 1, a deployable active radar countermeasure 100 or "smart chaff" may comprise a body 102, antenna elements 104, and RF electronics 106. For example, the body 102 may be generally ribbon-shaped and of a predetermined length of flexible reflective material (e.g., aluminum, other lightweight metals, polymers) sufficiently light as to remain airborne for a short operating duration, e.g., 2-3 minutes. The antenna elements 104 may include a metallization pattern printed onto the body 102 to provide passive reflectivity in addition to the active reflectivity generated by the RF electronics 106. The body 102 may serve as a housing for a flexible battery activated by deployment or contact with the air, with the metallized antenna elements 104 printed thereon. The flexible battery may be configured to provide power to the RF electronics 106 during the operating duration.

The passive reflectivity of the deployable active radar countermeasure 100 may be determined by the length of the body 102. For example, the predetermined length of each body 102 may determine the banded passive frequency response of the deployable active radar countermeasure 100, such that the deployable active radar countermeasure 100 is associated with a particular passive frequency response (e.g., between 1 GHz and 20 GHz) corresponding to a length of the body 102.

The deployable active radar countermeasures 100a-b may be implemented and may function similarly to the deployable active radar countermeasure 100, except that the deployable active radar countermeasures 100a-b may each be associated with bodies 102a-b of a particular length differing from that of the body 102a. Accordingly, the deployable active radar countermeasures 100a-b may each be associated with a different passive frequency response.

Figure 2:
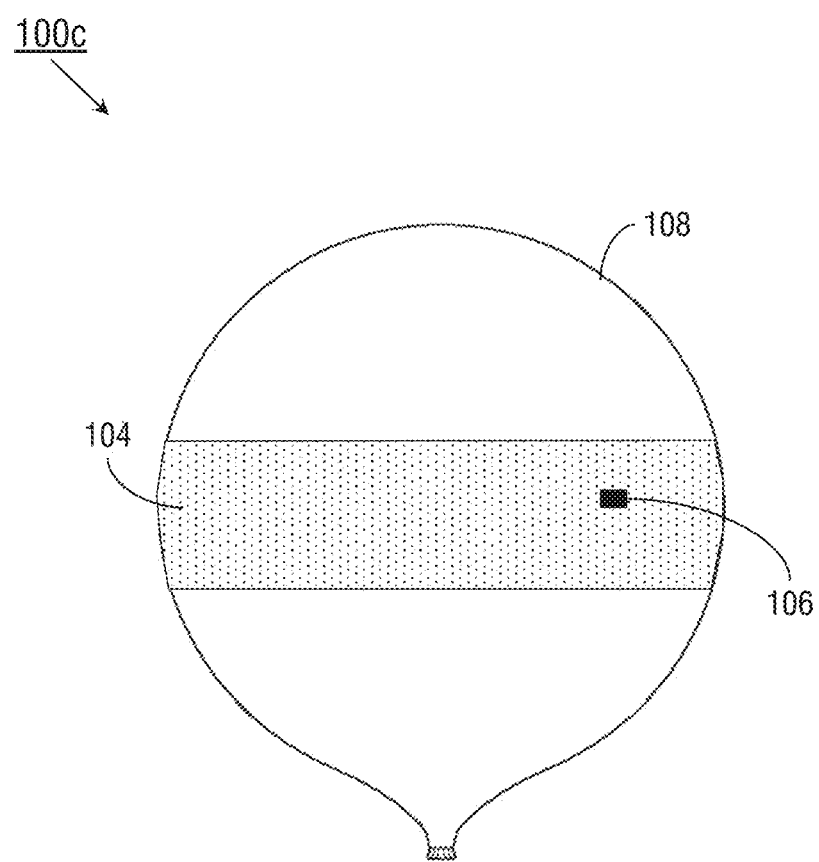
FIG. 2 illustrates a deployable active radar countermeasure of FIG. 1.

Referring now to FIG. 2, the deployable active radar countermeasure 100c may be implemented and may function similarly to the deployable active radar countermeasure 100 of FIG. 1, except that the deployable active radar countermeasure 100c may include an inflatable body (108) inflated with a lighter-than-air gas (e.g., helium) to maintain the deployable active radar countermeasure 100c at altitude for the operating duration. The antenna elements 104 may be fully or partially printed onto the exterior surface of the inflatable body 108, and the RF electronics 106 attached thereto.

Figure 3:
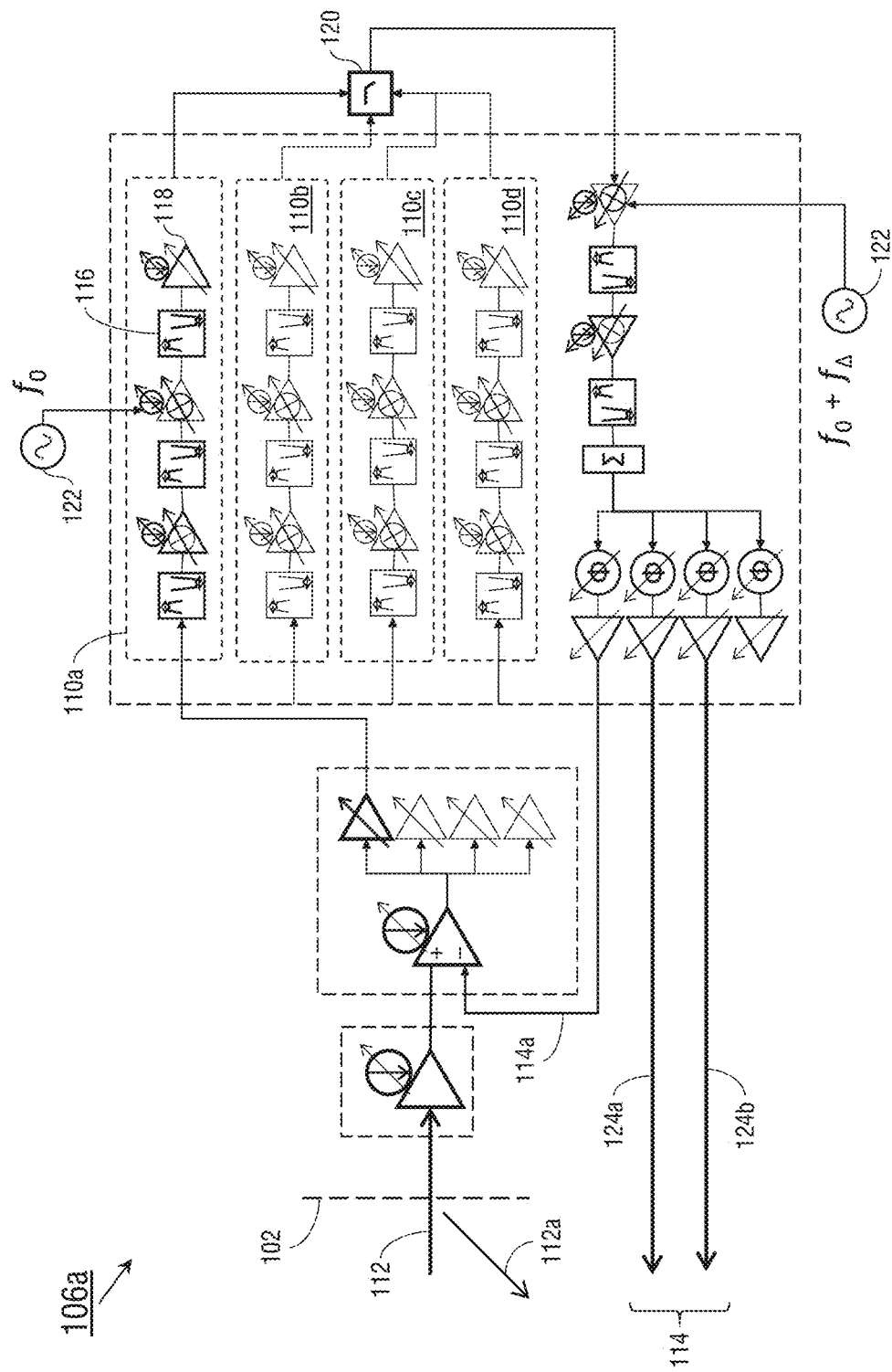
FIG. 3 is a diagrammatic illustration of a radio frequency integrated circuit (RFIC) of the deployable active radar countermeasures of FIG. 1.

Referring now to FIG. 3, the RF electronics 106a may be implemented and may function similarly to the RF electronics 106 of FIG. 1-2, except that the RF electronics 106a may include an RF integrated circuit (RFIC) bonded to one or more of the body (102, FIG. 1) of the deployable active radar countermeasure (100, FIG. 1) or the antenna elements (104, FIG. 1) printed thereonto. For example, the RFIC 106a may include an RFIC die with glop-top encapsulation to protect and insulate the RFIC components.

The RFIC 106a may include four wirebond-defined receiving paths 110a-d for receiving an inbound RF radar surveillance signal (112) having a frequency between 1 GHz and 20 GHz. Each receiving path 110a-d may be of variable length, the wirebond length corresponding to a response frequency range similarly between 1 GHz and 20 GHz (e.g., in 500 MHz bands). The frequency of an active RF echo signal 114 (e.g., response signal) transmitted by the deployable active radar countermeasure (100, FIG. 1) may be determined by the wirebond length and the RFIC programming.

It is contemplated that the receiving paths 110a-d may provide an image rejection ratio (IMRR) between 50 and 70 dB. Each receiving path 110a-d may include tunable filters (116), combined amplifier/mixers (118), and intermediate frequency (IF) low-pass filters (120) programmable for adjusting the inbound surveillance signal 112 to generate an echo signal 114, e.g., to mimic a particular aircraft. For example, the tunable filters 116 may include reconfigurable RF components comprising multiple paths and capable of generating multiple filtered signals, e.g., adjusting the amplitude or phase of an echo signal 114 by shifting the amplitude or phase of the surveillance signal 112 via bandpass and notch filters tunable to a center frequency between 1 GHz and 20 GHz. Similarly, the reconfigurable amplifier/mixers 118 may include components individually reconfigurable as amplifiers and mixers (as well as local oscillators 122) for upconverting or amplifying an inbound surveillance signal 112 as needed, e.g., to offset a frequency of the echo signal 114 from that of the surveillance signal 112 (e.g., by 500 MHz). Examples of reconfigurable components are taught by U.S. Pat. No. 9,240,815, the contents of which are hereby incorporated by reference in their entirety. As a further example, the deployable active radar countermeasure 100 may, via a combination of the passively reflected surveillance signal (112a) and the offset echo signal 114, simulate a Doppler shift and generate a false return of a moving target. A frequency offset (122) provides the means to present a Doppler shift of an approaching or exiting target on the returning echo signal (114). The RFIC 106a may include two transmit paths 124a-b for arbitrary polarization control, such that the output active-RF echo signal 114 may include one or both of a horizontally polarized echo signal (transmit path 124a) and a vertically polarized echo signal (transmit path 124b). An additional copy of the transmitted echo signal (114a) may be fed back into the receive paths 110a-d to provide cancellation, so as not to cause self-interference (e.g., with the transmit VGAs & phase shifters 116, 118 of the top receive path 110a).

Figure 4:
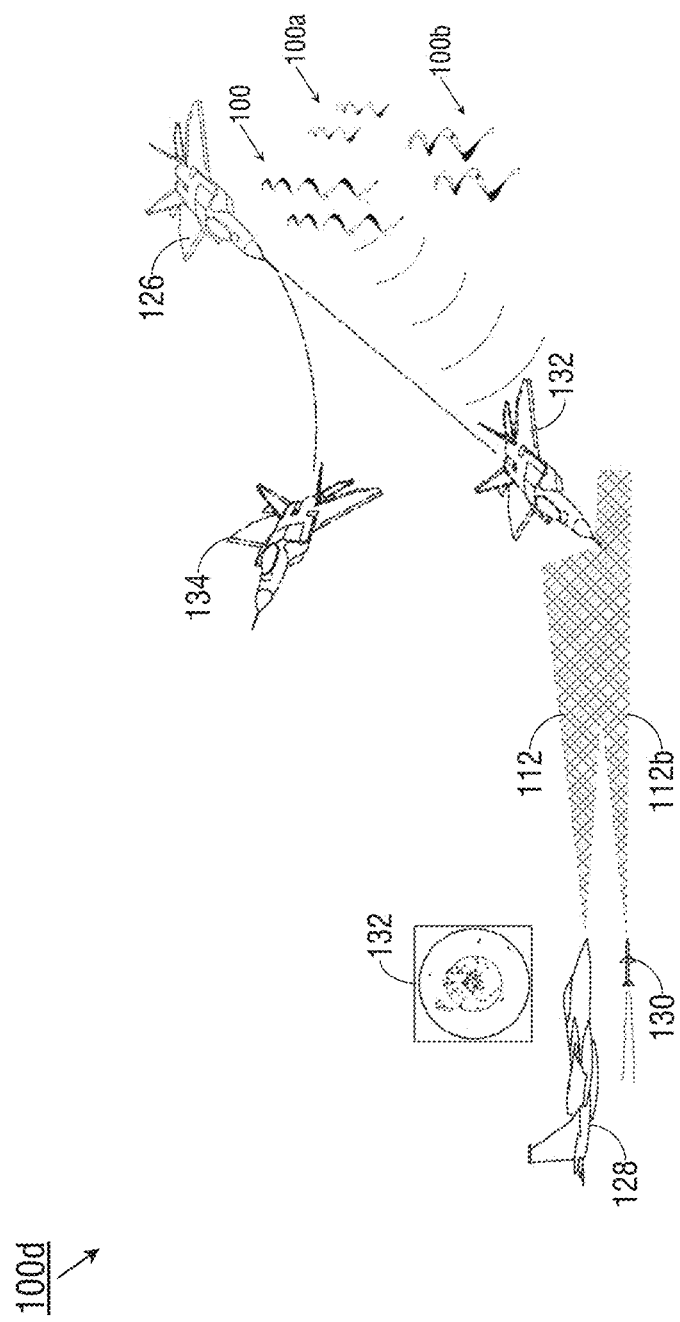
FIG. 4 illustrates a deployable active radar countermeasure system including the deployable active radar countermeasures of FIG. 1.

Referring now to FIG. 4, the deployable active radar countermeasure system 100d may be implemented and may function similarly to the deployable active radar countermeasures 100, 100a-c of FIGS. 1 and 2, except that a target aircraft 126 under surveillance from an enemy aircraft 128 (and/or an enemy missile 130) may deploy the active radar countermeasure system 100d to generate false or misleading returns (132) indicating, e.g., a false position and heading (134) of the target aircraft 126. For example, the target aircraft may change its heading (136) upon deployment of the active radar countermeasure system 100d, the component deployable active radar countermeasures (100, 100a-b) of which may be arranged and programmed, when deployed as a cloud, to represent the reflection pattern of a particular aircraft. For example, the active radar countermeasure system 100d may passively and actively reflect the surveillance signals 112, 112b of the enemy aircraft 128 and enemy missile 130 respectively in such a way as to present a false profile (132) of the target aircraft 126 in motion. The active radar countermeasure system 100d may include deployable active radar countermeasures 100 of a relatively long length, deployable active radar countermeasures 100a of a relatively moderate length, and deployable active radar countermeasures 100b of a relatively short length. For example, the deployable active radar countermeasures 100 may be programmed to return active RF echo signals (114, FIG. 3) having frequencies of 0.5 GHz and 1 GHz, with corresponding offset signals of 1 GHz and 1.5 GHz; the deployable active radar countermeasures 100a may be programmed to return active RF echo signals 114 having frequencies of 4.5 GHz and 5 GHz, with corresponding offset signals of 5 GHz and 5.5 GHz; and the deployable active radar countermeasures 100b may be programmed to return active RF echo signals 114 having frequencies of 9.5 GHz and 10 GHz, with corresponding offset signals of 10 GHz and 10.5 GHz. The surveillance radar system aboard the enemy aircraft 128 may process the resulting configuration of active RF echo signals 114 (along with passively reflected echo signals 112a (FIG. 3) reflected by the body (102) of the deployable active radar countermeasure device (100, FIG. 1)) as a target aircraft having a different position and heading (132) than its actual position and heading (134).

As will be appreciated from the above, systems and methods according to embodiments of the inventive concepts disclosed herein may provide effective false returns to surveillance radar systems, including simulated moving targets and aircraft-specific reflection profiles, without the expense or complexity of towable decoys and onboard DRFM systems.

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

We claim:

1. A deployable active radar countermeasure device, comprising:
    a flexible substrate of a predetermined length;
    one or more antenna elements printed upon the flexible substrate;
    and
    at least one radio frequency (RF) circuit bonded to the flexible substrate, the RF circuit comprising:
        a plurality of receive paths configured to receive a surveillance signal via the one or more antenna elements, the surveillance signal associated with a surveillance frequency;
        circuitry for adjusting at least one echo signal based on at least one of the surveillance signal and the predetermined length, the echo signal associated with an echo frequency;
        and
        two or more transmit paths configured to transmit the echo signal via the antenna elements.

2. The deployable active radar countermeasure device of claim 1, wherein one or more of the surveillance frequency and the echo frequency is between 1 GHz and 20 GHz.

3. The deployable active radar countermeasure device of claim 2, wherein:
    the at least one echo frequency is associated with at least one predetermined offset from the surveillance frequency.

4. The deployable active radar countermeasure device of claim 1, wherein the flexible substrate includes a passive reflector.

5. The deployable active radar countermeasure device of claim 1, wherein the at least one RF circuit is configured to adjust one or more of an echo phase and an echo amplitude associated with the echo signal.

6. The deployable active radar countermeasure device of claim 1, wherein the flexible substrate comprises a flexible battery coupled to one or more of the antenna elements and the at least one RF circuit.

7. The deployable active radar countermeasure device of claim 1, wherein the plurality of receive paths include at least one wirebond path having a wirebond length.

8. The deployable active radar countermeasure device of claim 7, wherein at least one echo frequency is based on the wirebond length.

9. The deployable active radar countermeasure device of claim 1, wherein the echo signal includes at least one of a horizontally polarized signal and a vertically polarized signal.

10. The deployable active radar countermeasure device of claim 1, wherein the device is a first device of a plurality of devices, the flexible substrate is a first flexible substrate having a first length, and the echo signal is a first echo signal associated with a first echo frequency,
    the plurality of devices configured to mimic at least one airborne object and including at least one second device comprising:
        a second flexible substrate having a second length;
        and
        circuitry for adjusting at least one second echo signal based on at least one of the surveillance signal and the second length, the second echo signal associated with a second echo frequency.

11. The deployable active radar countermeasure device of claim 10, wherein:
    the plurality of devices is deployable via a first aircraft;
    and
    the airborne object includes at least one of the first aircraft and a second aircraft.

12. The deployable active radar countermeasure device of claim 1, wherein the flexible substrate corresponds to an exterior surface of an inflatable lighter than air object.

* * * * *